Figure 3:
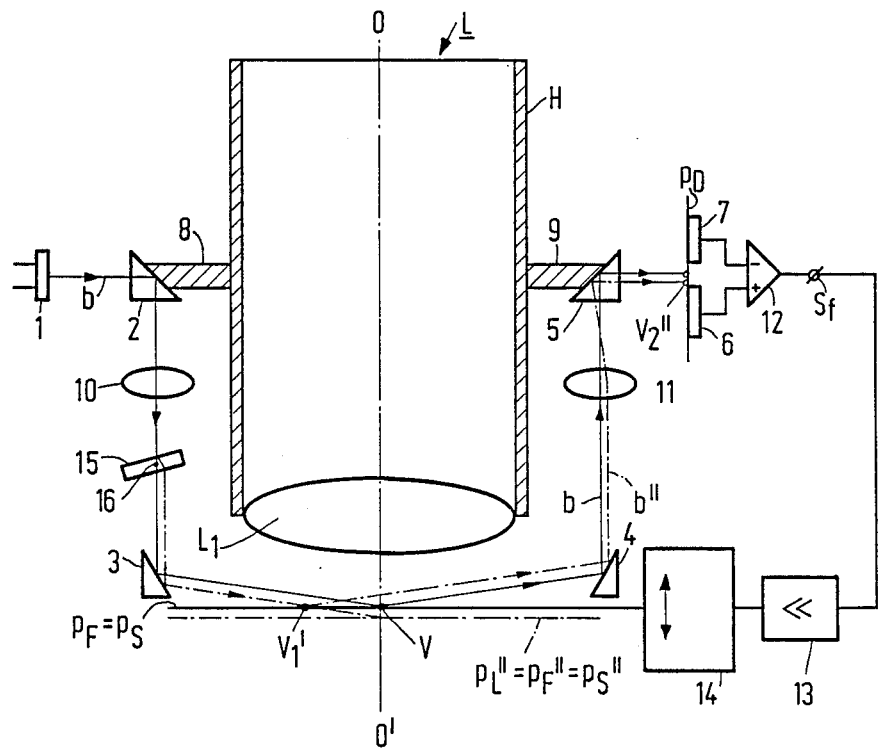

United States Patent [19]

van der Werf et al.

[11] Patent Number: 4,866,262
[45] Date of Patent: Sep. 12, 1989

[54] OPTICAL IMAGING ARRANGEMENT COMPRISING AN OPTO-ELECTRONIC FOCUSSING-ERROR DETECTION SYSTEM

[75] Inventors: Jan E. van der Werf; Johannes W. M. Biesterbos, both of Eindhoven, Netherlands

[73] Assignee: U.S. Philips Corporation, New York, N.Y.

[21] Appl. No.: 157,103

[22] Filed: Feb. 9, 1988

Related U.S. Application Data

[63] Continuation of Ser. No. 876,508, Jun. 20, 1986, abandoned.

[30] Foreign Application Priority Data

Feb. 3, 1986 [NL] Netherlands .................... 8600253

[51] Int. Cl.$^4$ ............................. G01J 1/20; G01J 1/34
[52] U.S. Cl. ........................................ 250/201; 356/4
[58] Field of Search ............... 250/201 AF, 201 PF, 250/201 DF; 356/1, 4; 369/44, 45, 46; 354/403; 355/30, 43

[56] References Cited

U.S. PATENT DOCUMENTS

| | | | |
|---|---|---|---|
| 3,974,327 | 8/1976 | Van Dijk | 250/201 DF |
| 3,992,574 | 11/1976 | Bouwhuis et al. | 250/201 DF |
| 4,363,962 | 12/1982 | Shida | 250/201 AF |
| 4,383,168 | 5/1983 | Luck | 250/201 AF |
| 4,570,059 | 2/1986 | Iijima | 354/403 |
| 4,589,773 | 5/1986 | Ido et al. | 356/1 |
| 4,631,396 | 12/1986 | Utsumi | 250/201 DF |
| 4,668,677 | 5/1987 | Tanaka | 355/30 |

Primary Examiner—David C. Nelms
Assistant Examiner—William L. Oen

[57] ABSTRACT

An optical imaging arrangement is described which comprises an opto-electronic focussing-error detection system (1, 2, 3, 4, 5, 6, 12, 13, 14, 18, 19, 20, 21) for determining a deviation between the image plane ($P_L$) of the imaging system (L) and a second plane ($P_S$) in which the image is to be formed. The image plane ($P_F$) of the focussing-error detection system is adjustable, for example by means of a pivotable plane-parallel plate (15), so that the zero point of the focussing-error signal ($S_f$) is adjustable.

7 Claims, 3 Drawing Sheets

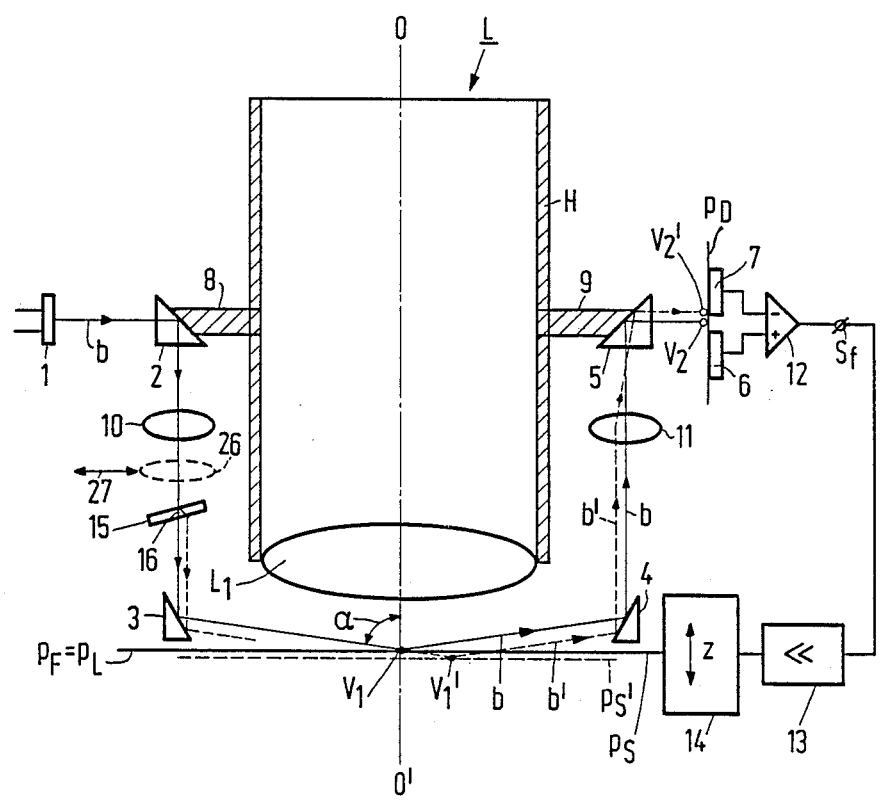
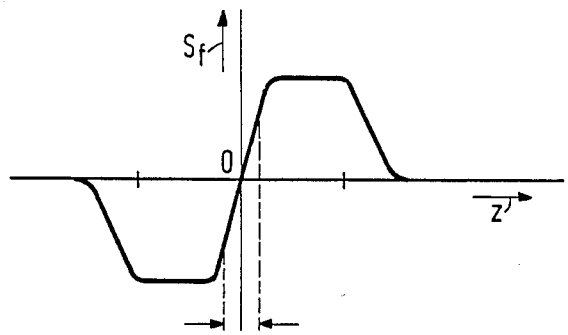
FIG.1
FIG.2

OPTICAL IMAGING ARRANGEMENT COMPRISING AN OPTO-ELECTRONIC FOCUSSING-ERROR DETECTION SYSTEM

This is a continuation of application Ser. No. 876,508, filed June 20, 1986, now abandoned.

The invention relates to an optical imaging arrangement comprising an opto-electronic focussing-error detection system for determining a deviation between the image plane of the imaging arrangement and a second plane in which an image is to be formed by the imaging arrangement, which detection system comprises a radiation source producing an auxiliary beam, two radiation-sensitive detectors which are situated at the same side of the second plane as the radiation source, and optical elements for aiming the auxiliary beam at the second plane, forming a radiation spot in this plane and for imaging this radiation spot in the plane of two detectors, the difference between the output signals of the two detectors being a measure of said deviation.

Lens systems by means of which minute details must be imaged have a large numerical aperture and, consequently, a small depth of focus. For lens systems of this type, which are employed, for example, for imaging a mask pattern onto a substrate in the fabrication of integrated circuits, it is important that a deviation between the actual plane in which an object, for example a mask pattern, is imaged and a plane in which it is to be imaged, for example the substrate plane, can be detected to enable the focussing of the lens system to be corrected in response thereto.

U.S. patent specification No. 4,356,392 describes an imaging arrangement which forms part of an apparatus for repeatedly exposing a semiconductor substrate via a mask pattern, which apparatus is referred as a "wafer stepper" and which comprises a focussing-error detection system of the kind described in the opening paragraph. This system forms part of a servo system for maintaining a constant distance between the projection lens system and the substrate. The output signal of the focussing-error detection system is applied to a drive system by means of which, for example, the projection lens system is moved along its optical axis depending on the magnitude and the sign of the focussing error in such a way that the projection lens system is always accurately in focus on the substrate.

The imaging arrangement, in conjunction with the focussing-error detection system in accordance with U.S. patent specification No. 4,356,392 has proved to be very suitable for use in the fabrication of integrated circuits with minimal details of line widths of the order of one micrometer or large. On account of the increasing demand for more electronic elements per unit area of the substrate, i.e. increasingly smaller dimensions of these elements, there is a growing need for an apparatus which can form repeated images whose details or line widths are smaller than 1 micrometer.

An optical imaging arrangement for such an apparatus should have a very high resolution, whilst the image field should be comparatively large, for example of the order of $10 \times$ mm$^2$. The use of such an imaging arrangement may pose a problem which until now was not serious, namely the problem that the performance of the imaging arrangement depends on ambient influences. For example, the focal plane of this arrangement may be displaced in the case of variations of, for example, the pressure of the medium in which the arrangement is situated, so that the image of a mask pattern on the substrate is no longer in focus, although the distance between the imaging arrangement and the substrate is correct. Said displacement cannot be detected by the focussing-error detection system because there is no change in the position of the substrate and the imaging arrangement relative to one another.

Further, it is generally desirable that the operator of said apparatus for forming images with submicrometer details has the possibility of shifting the zero point of the focussing control or introducing a specific "offset" in the focussing-error signal in conformity with the results obtained by means of a test substrate which is exposed by means of the apparatus and is subsequently tested.

It is the object of the present invention to provide an imaging arrangement comprising a focussing-error detection system which meets this requirement and which mitigates the aforementioned drawback. To this end the imaging arrangement in accordance with the invention is characterized in that the focussing-error detection system comprises adjustable means for moving the image of the radiation spot formed in the plane of the detectors relative to the detectors independently of said deviation, to offset the zero point in the focussing-error signal.

As a result of this, the focussing-servo system controls in response to a reference which depends on the magnitude of the signal by means of which said adjustable means are controlled. This signal may be, for example, proportional to the pressure of the medium in which the imaging arrangement is situated or it may be a signal introduced by the operator of the apparatus.

The adjustable means may comprise an actuator, for example of an electromechanical type, for displacing the entire focussing-error detection system relative to the imaging arrangement along the optical axis of the imaging arrangement.

As this requires a comparatively large mass to be displaced with a accuracy of the order of one tenth of a micrometer it is in practice preferred to use an embodiment which is characterized in that one of the optical elements in the focussing-error detection system is translatable or pivotable relative to the other optical elements in this system.

A preferred embodiment of the invention is characterized further in that the focussing-error detection system comprises an adjustable optical element of low optical power.

This element does not form part of the original focussing-error detection system but is specifically incorporated in the focussing-error detection system to render the zero point of the focussing-error signal adjustable. As a result of the low optical power of the adjustable element a pivotal movement though a comparatively large angle or a translation over a comparatively large distance of the element results in a comparatively small displacement of the radiation spot which is re-imaged on the detectors, so that the desired displacement of this radiation spot can be performed with high accuracy.

An embodiment of the focussing-error detection system comprising an adjustable optical element is characterized in that said element comprises a weak lens which is movable transversely of the axis of the sub-beam.

Since a pivotal movement is mechanically easier to realize with the desired accuracy than a translation a preferred embodiment of the focussing-error detection system is characterized in that the adjustable optical element comprises a pivotable thin plane-parallel plate.

An additional advantage of the invention is obtained in an optical imaging arrangement which is characterized in that a beam inverting element is arranged in the path of the auxiliary beam which is reflected a first time from the second plane, which element reflects the auxiliary beam along itself and in that the two detectors are arranged in the path of the auxiliary beam which is reflected a second time from the second plane. As described in U.S. patent specification No. 4,356,392 this additional step ensures that local differences in reflection of the surface defining the second plane have no influence on the focussing-error signal, whilst the sensitivity of the focussing-error detection system is increased by a factor of two. If the focal plane of the imaging arrangement is shifted as a result of, for example, a change in pressure of the surrounding medium and the zero point in the focussing-error signal is not shifted as in accordance with the invention, the radiation spot formed in the second plane by the emitted auxiliary beam will no longer coincide with the radiation spot formed in the second plane by the returning auxiliary beam and the focussing-error signal will again be influenced by local differences in reflection of the surface defining the second plane.

The invention may be used advantageously in an apparatus for the repeated imaging of a mask pattern onto a substrate, comprising an imaging arrangement which is situated between a mask-pattern holder and a substrate holder and which comprises a focussing-error detection system. This apparatus is characterized in that the focussing-error signal with adjustable zero point is applied to actuating means for one of the parts: imaging arrangement and substrate holder, for moving these parts relative to one another along the optical axis of the imaging arrangement.

In addition, the invention is suitable for general use in imaging arrangement comprising a focussing-error detection system, where the focal plane of the imaging arrangement may become displaced as a result of changes in the surrounding medium or is required to be adjustable by a user. Examples of this are microscopes, both of the reflection type and of the transmission type. Because of the grazing incidence of the auxiliary beam even a transparent object will reflect an amount of radiation which is adequate for the purpose of focussing-error detection.

Figure 4A:
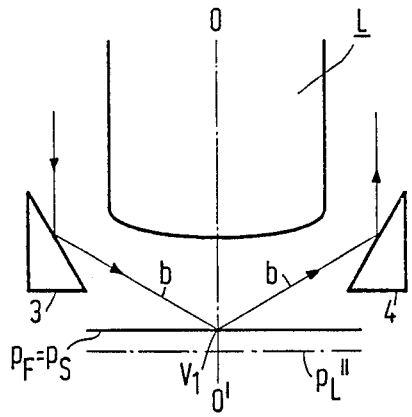
Figure 4B:
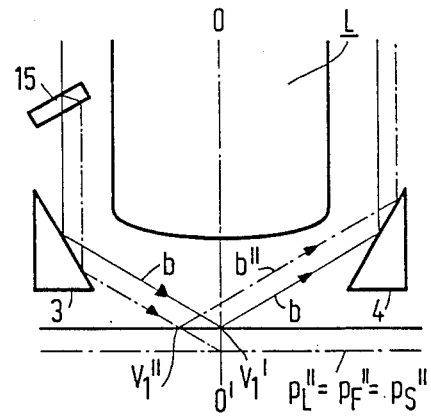
Figure 5:
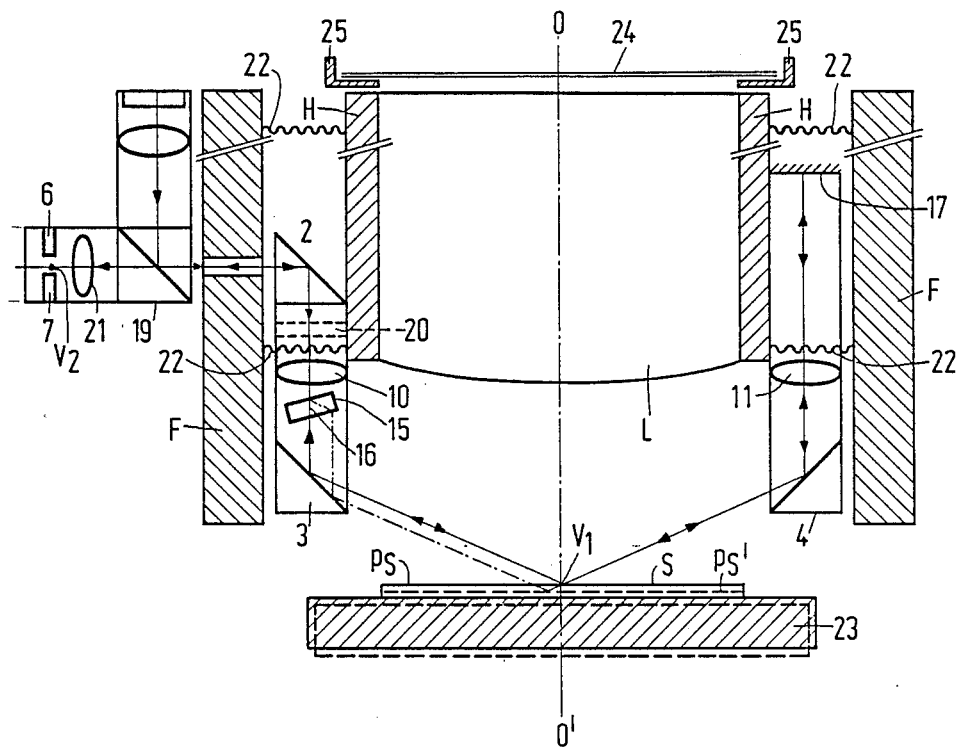

The invention will now be described in more detail, by way of example, by a description of its use in an apparatus for the repeated imaging of a mask pattern onto a semiconductor substrate. Reference is made to the drawings, in which:

FIG. 1 shows an imaging arrangement in accordance with the invention,

FIG. 2 shows the variation of the focussing-error signal as a function of distance between the imaging arrangement and the second plane, FIG. 3 illustrates the operation of the adjustable optical element in the focussing-error detection system, FIGS. 4a and 4b illustrate the difference in operation between the known and the novel focussing-error detection system in the case of a varying position of the image plane of the imaging arrangement, and FIG. 5 shows a second embodiment of the invention, and schematically, an apparatus for the repeated imaging of a mask pattern onto a substrate.

In FIG. 1 an imaging arrangement L serves for imaging an object, not shown, in a plane $P_S$, which may be the plane defining the surface of a semiconductor substrate and which is referred to in the foregoing as "the second plane". The imaging arrangement may comprise a plurality of lens elements mounted in a lens holder H, one of these elements $L_1$ being shown in FIG. 1. A focussing-error detection system is associated with the imaging arrangement and comprises a radiation source 1, preferably a diode laser, a plurality of reflecting elements, for example prisms, 2, 3, 4 and 5, and two radiation-sensitive detectors 6 and 7, for example photodiodes. The focussing-error detection system may be rigidly connected to the imaging arrangement L, which is schematically represented by the connections 8 and 9 between the prisms 2 and 5 and the arrangement L. The auxiliary beam b emitted by the source 1 is directed towards the plane $P_S$ by the prisms 2 and 3 and the beam reflected from this plane is transmitted to detectors 6 and 7 via the prisms 4 and 5. A first lens 10 forms an image in the form of a radiation spot $V_1$ in a plane $P_F$, which is the image plane of the focussing-error detection system, whilst a second lens 11 images this radiation spot as a radiation spot $V_2$ in the plane $P_D$ of the detectors. The focussing-error detection system is aligned in such a way relative to the imaging arrangement L that the intersection of the optical axis OO' with the image plane $P_L$ of the imaging arrangement L, which image plane is horizontal in this intersection and coincide with the image plane $P_F$ of the focussing-error detection system, is imaged in the plane of the detectors 6 and 7 by the lens 11.

If the image plane $P_L$ coincides with the plane $P_S$, which defines a more reflecting of less reflecting surface, the radiation spot $V_1$ is imaged as a radiation spot $V_2$ which is disposed symmetrically relative to the detectors 6 and 7. These detectors then receive equal radiation intensities. The output signal, the focussing-error signal $S_f$, of a differential amplifier connected to the detectors 6 and 7 is then zero. When the distance between the plane $P_S$ and the imaging system changes the re-imaged radiation spot travels over the detectors 6 and 7. If, as is shown in FIG. 1, the plane $P_S$ is shifted downwards, indicated by $P_S'$, the radiation spot $V_1'$ formed in this plane is imaged in $V_2'$ along the radiation path represented in broken lines. The detector 6 then receives a lower radiation intensity than the detector 7 and the signal $S_f$ is, for example, negative. When the plane $P_S$ is shifted upwardly this situation is reversed and the detector 6 receives a higher radiation intensity than the detector 7. The signal $S_f$ is then, for example, positive. The signal $S_f$ is applied to a control circuit 13 for actuator means 14 by which the axial position of the substrate plane $P_S$ or of the imaging arrangement L can be corrected.

The angle of incidence $\alpha$ of the sub-beam b relative to the plane $P_S$ is selected to be as large as possible, for example of the order of 80°, in order to obtain a maximum sensitivity to errors in the position of the plane $P_S$ relative to the imaging arrangement L and in order to obtain a maximum reflection of the sub-beam b from the plane $P_S$.

FIG. 2 shows the focussing-error signal $S_f$ as a function of the distance z between the plane $P_S$ and the plane $P_L$ of the imaging arrangement. This signal is linear around the point $z=0$, which represents the situation in which the two planes coincide. After having reached an extreme value, the signal $S_f$ remains constant as long as the radiation spot $V_2'$ is still situated above one of the detectors, after which it becomes zero. The focussing-error detection system is very accurate, but the overall linear control range d is only of the order of a few, for example six, micrometers.

If it is anticipated that as a result of variations in the medium in which the imaging arrangement is situated, for example a change in pressure causing a variation of the refractive index, the focussing of this arrangement may vary, which cannot be observed by the focussing-error detection system, it is required to have a possibility of compensating for this variation. Further, it is generally required that the focussing can by adjusted manually on the basis of a test image formed on a test substrate by the imaging arrangement in the case of an optimum adjustment of the distance between the imaging arrangement and this substrate.

In order to meet these requirements it may be considered to shift the zero point of the focussing-error signal, i.e. The control point of the focussing servo system, electronically by applying to the control circuit 13 a signal proportional to, for example, the pressure variation or a signal determined by the operator of the system. However, because of the small linear control range d of the signal $S_f$ this signal should remain very small. Moreover, in a focussing-error detection system in which the sub-beam is reflected twice from the second plane or substrate, the advantages of this specific system are lost because the radiation spots formed in the second plane during the first passage of the sub-beam and during the second passage of this beam will no longer coincide.

In accordance with the invention the zero-point shift or offset in the focussing-error signal is obtained by shifting the position of the re-imaged radiation spot $V_2$ in the plane of the detectors depending on said pressure variation or the magnitude of the signal selected by the operator of the system. As shown in FIG. 3, this offset can be obtained by shifting the image plane $P_F$ of the focussing-error detection system, i.e. The plane in which the radiation source 1 is imaged in focus. This image plane can be shifted, for example by tilting a plane-parallel plate 15 about an axis 16. The shifted image plane of the focussing-error detection system, designated $P_F''$. $P_L''$, is the image plane of the imaging arrangement which is shifted under the influence of ambient variations. Since even in the case of a correct distance between the substrate plane $P_S$ and the imaging arrangement, the plane $P_F''$ does not coincide with the plane $P_S$, the image $V_2''$ of the radiation spot $V_1''$ formed in the substrate plane is shifted in the detector plane $P_D$ relative to the image $V_2$ and the focussing-error signal is unequal to zero. Under the influence of this signal the substrate plane is shifted from $P_S$ to $P_S''$ in such a way that the focussing-error signal becomes zero again. Thus, the distance between the substrate plane and the imaging system L is adapted to, for example, the pressure variation or the signal entered by the operator of the system.

FIGS. 4a and 4b schematically illustrate the difference in operation between the known focussing-error detection system and the focussing-error detection in accordance with the invention in the case of the shift of the image plane $P_L$ of the imaging arrangement or a focus correction applied by the operator of the system. These Figures show only that part of the radiation path between the two lenses 10 and 11. Again the image plane of the focussing-error detection system is designated $P_F$ and the second or substrate plane is designated $P_S$. In the known focussing-error detection system, FIG. 4a, and which only the distance between the imaging arrangement L and the substrate is corrected in such a way that the plane $P_F$ coincides with the plane $P_S$, a shift of the image plane $P_L''$ of the imaging system is not detected. Indeed, this shift does not influence the position of the radiation spot $V_1$ in the substrate plane $P_S$ and therefore does not influence the position of the image of this spot on the detectors.

In the focussing-error detection system in accordance with the invention, FIG. 4b, the image plane $P_F''$ of the focussing-error detection system is shifted in proportion to the displacement of the image plane $P_L''$ of the imaging arrangement. As a result of this, the radiation spot $V_1''$ in the substrate plane $P_S$ is shifted and consequently the image of this spot on the detectors. Therefore the focussing-error signal $S_f$ becomes unequal to zero and the position of the substrate plane is corrected in such a way that this plane $P_S''$ coincides with the shifted image planes $P_F''$ and $P_L''$.

The image plane $P_F$ of the focussing-error detection system can be shifted in various ways. A first possibility is to move the entire focussing-error detection system relative to the imaging arrangement L, for which purpose for example the connections 8 and 9 in FIG. 1 could be made slidable. Since a displacement with the desired accuracy of the order of tenths of micrometers of the comparatively large mass of the focussing-error detection system is not a simple task, it is in practice preferred to move a light-weight element within this system. Therefore, it is preferred by far to arrange a plane-parallel plate 15 which is pivotable about an axis 16 in the focussing-error detection system. By tilting this plate the optical pathlength of the beam b is changed and hence the position of the plane $P_F$ in which the radiation source 1 is imaged. If the plate is thin, for example of the order of 150 micrometers, tilting through an angle of for example 1° results in a very small displacement, for example of 1 micrometer, of the plane $P_F$, so that the position of the plane $P_F$ can be adjusted very accurately.

Instead of a pivotable plane-parallel plate it is also possible to arrange a weak lens in the focussing-error detection system. Moving such a lens 26, indicated in broken lines in FIG. 1, in the direction indicated by the arrow 27 also yields the desired displacement.

Instead of by shifting the image plane $P_F$ the desired displacement of the radiation spot $V_2$ over the detectors 6 and 7 can also be obtained by tilting or moving an element arranged in the radiation path between the substrate and the plane $P_D$ of the detectors. Thus, the elements 15 and 26 may alternatively be arranged in the right-hand part of the arrangement shown in FIGS. 1 and 3.

Further, the displacement of the radiation spot $V_2$ over the detectors can be obtained by tilting or moving the elements of the focussing-error detection system itself, such as by tilting the prisms 2, 3, 4 or 5, moving one of the lenses 10 and 11, or the diode laser 1, or the detectors transversely of the axis of the beam b.

FIG. 5 shows a focussing-error detection system which combines the advantages of the construction in accordance with U.S. patent specification No. 4,356,392 with the advantage of the present invention.

In the path of the beam b reflected from the plane $P_S$ a beam-inverting element or retro-reflector is arranged. Such a retro-reflector may comprise a concave mirror or an element referred to as a "cat's eye" which, as is shown in FIG. 5, comprises the lens 11 and a mirror 17 arranged in the focal plane of the lens 11. Such a retroreflector reflects the beam b along itself to focus it at the location of the same radiation spot $V_1$. As a described in U.S. patent specification No. 4,356,392 a part of the beam b which is originally situated in a first part of the radiation spot $V_1$ will be situated after reflection by the mirror 17, in a second part situated diametrically opposite the first part of the radiation spot $V_1$. In this way local differences in reflection as a result of, for example, light-diffusing structures in the plane $P_S$ cannot influence the intensity distribution within the radiation spot $V_2$ formed on the detectors 6 and 7. When the image plane $P_F$ of the focussing-error detection system is displaced in the manner in accordance with the invention the advantages of reflecting the sun-beam b twice at the same location in the plane $P_S$ are maintained.

In order to obtain an adequate focussing-error signal even for small displacements of the plane $P_S$ relative to the imaging arrangement the radiation spot $V_1$ should have a high brightness. Therefore, the radiation source 1 is suitably a laser which produces a stable beam. The beam b produced by this laser, suitably a diode laser, is converted into a parallel beam by a lens. A part of this beam is reflected towards the prism 2 by a beam splitter 19, which may comprises a semi-transparent mirror, a semi-transparent prism or a combination of a polarization-sensitive splitter prism 19 and a $\lambda/4$-plate 20, where $\lambda$ is the wavelength of the beam b. A part of the returning beam, which has been reflected twice from the plane $P_S$, is transmitted to the two detectors 6 and 7 by the beam splitter 19. A lens 21 forms an image $V_2$ of the radiation spot $V_1$ in the plane of the detectors.

The use of a polarization-sensitive prism and a $\lambda/4$-plate ensures that coupling-in of the beam originating from the source 1 and coupling-out of the beam which is reflected twice from the substrate can be effected substantially without any losses. The beam issuing from the source is polarized in such a way that it is almost fully transmitted by the prism 19. On its path to and fro this beam traverses the $\lambda/4$-plate twice, so that its direction of polarization is rotated through 90° and the beam is subsequently almost fully transmitted by the prism 19.

Suitably, the $\lambda/4$-plate is arranged in the path of the emitted beam before the substrate S. It is then no longer important that the reflection coefficient of the substrate surface defining the plane $P_S$ for a beam having a first direction of polarization may differ from the coefficient for a beam having a second direction of polarization perpendicular to the first direction. The linearly polarized radiation emitted by the diode laser is converted into circularly polarized radiation by the $\lambda/4$-plate 20, so that the radiation incident on the substrate surface defining the plane $P_S$ comprises two beam components which are polarized in two mutually perpendicular directions. The $\lambda/4$-plate then has a double function.

When the imaging arrangement is used in an apparatus for the repeated exposure of a substrate, this arrangement is mounted in a projection column F, as is shown in FIG. 5. This arrangement serves for imaging a mask pattern 24 placed on a mask table 25 in the plane $P_S$ of the surface of a substrate S situated on a substrate table 23. The imaging arrangement or a part thereof is movable along the optical axis OO' by actuating means, known per se and not shown, which are controlled by the signal $S_f$. Alternatively, the imaging arrangement may be stationary and the substrate table 23 may be moved along the optical axis, again in response to the signal $S_f$. The projection column F is not movable in directions perpendicular to the optical axis. As is indicated in FIG. 5, the lens holder H, as the case may be together with the focussing-error detection system, may be secured in a projection column F by means of, for example, two springs 22 or diaphragms. The substrate is movable relative to the projection column in two mutually perpendicular directions in a plane transverse to the optical axis OO'. For more details on the apparatus for the repeated imaging of a mask pattern onto a substrate reference is made to, for example, the article: "Automatic Alignment System for Optical Projection Printing", in "IEEE Transactions on Electron Devices", Vol. ED-26. no. 4, April 1979, pages 723–728.

When determining a focussing error by means of the focussing-error detection system described herein no use is made of special properties of the imaging arrangement or the substrate or the surface defining the second plane. It is only necessary and adequate that this surface is slightly reflecting. Therefore, the focussing-error detection system may be used in all those cases where very precise images with minute details have to be formed and variations in ambient parameters may influence the lens action of the imaging arrangement. An example of such a system is a microscope.

What is claimed is:

1. An optical imaging arrangement comprising an opto-electronic focussing-error detection system for determining a deviation between the image plane of the imaging arrangement and a second plane in which a primary image is to be formed by the image arrangement, which detection system comprises a radiation source producing an auxiliary beam, two radiation-sensitive detectors which are situated at the same side of the second plane as the radiation source, and optical elements for aiming the auxiliary beam at the second plane, forming a radiation spot in this plane and for imaging this radiation spot in the plane of two detectors, the difference between the output signals of the two detectors being a measure of said deviation, said system normally producing a zero deviation signal when said primary image is in said second plane characterized in that the focussing-error detection system comprises adjustable means for moving the image of the radiation spot formed in the plane of the detectors independently of said deviation to offset the zero point in the focussing error signal whereby said zero deviation signal is produced when said primary image is outside said second plane.

2. An optical imaging arrangement as claimed in claim 1, characterized in that said adjustable means is translatable or pivotable relative to the other elements in the system.

3. An optical imaging arrangement as claimed in claim 2, characterized in that said adjustable means is an optical element of low optical power.

4. An optical imaging arrangement as claimed in claim 3, characterized in that said adjustable means comprises a weak lens which is movable transversely of the axis of the auxiliary beam.

5. An optical imaging arrangement as claimed in claim 3, characterized in that said adjustable means comprises a pivotable thin plane-parallel plate.

6. An optical imaging arrangement as claimed in claim 1, 2, 3, 4 or 5, characterized in that a beam-inverting element is arranged in the path of the auxiliary beam which is reflected a first time from the second plane, which element reflects the auxiliary beam along itself and in that the two detectors are arranged in the path of the auxiliary beam which is reflected a second time from the second plane.

7. An apparatus for the repeated imaging of a mask pattern onto a substrate, comprising an imaging arrangement provided with a focussing-error detection system as claimed in claim 6, which imaging arrangement is situated between a mask-pattern holder and a substrate holder, characterized in that the focussing-error signal with adjustable zero point is applied to actuating means for moving the imaging arrangement and the substrate holder, relative to one another along the optical axis of the imaging arrangement.

* * * * *